(12) United States Patent
Dohadwala et al.

(10) Patent No.: US 11,329,665 B1
(45) Date of Patent: May 10, 2022

(54) BWT CIRCUIT ARRANGEMENT AND METHOD

(71) Applicant: Xilinx, Inc., San Jose, CA (US)

(72) Inventors: Mohammad Saifee Dohadwala, San Jose, CA (US); Raghukul B. Dikshit, San Jose, CA (US)

(73) Assignee: XILINX, INC., San Jose, CA (US)

( * ) Notice: Subject to any disclaimer, the term of this patent is extended or adjusted under 35 U.S.C. 154(b) by 236 days.

(21) Appl. No.: 16/710,522

(22) Filed: Dec. 11, 2019

(51) Int. Cl.
  *H03M 1/00* (2006.01)
  *H03M 7/30* (2006.01)
  *H04N 19/60* (2014.01)

(52) U.S. Cl.
  CPC .......... *H03M 7/3077* (2013.01); *H04N 19/60* (2014.11)

(58) Field of Classification Search
  CPC .................................................. H03M 7/3077
  USPC ......................................................... 707/693
  See application file for complete search history.

(56) References Cited

U.S. PATENT DOCUMENTS

| | | | | |
|---|---|---|---|---|
| 7,734,671 B1* | 6/2010 | Ferguson | .......... | G06F 16/90344 707/753 |
| 9,137,336 B1* | 9/2015 | Zalunin | .......... | H03M 7/30 |
| 2001/0051941 A1* | 12/2001 | Tonomura | ............. | H03M 7/30 |
| 2009/0193213 A1* | 7/2009 | Winter | .......... | H03M 7/30 711/165 |
| 2013/0019029 A1* | 1/2013 | Jagmohan | ........... | H03M 7/3068 709/247 |
| 2020/0402618 A1* | 12/2020 | Jiang | ......... | G16B 50/30 |

OTHER PUBLICATIONS

Burrows, M. et al., "A Block-sorting Lossless Data Compression Algorithm," SRC Research Report #124, May 10, 1994.
Mccreight, Edward M., "A Space-Economical Suffix Tree Construction Algorithm," Journal of the Association for Computing Machinery, vol. 23, No. 2, Apr. 1976, pp. 262-272.
Manber, Udi et al., Suffix Arrays: A New Method for On-Line String Searches, Siam J. Comput., vol. 22, No. 5, pp. 935-948, Oct. 1993.

* cited by examiner

*Primary Examiner* — Monica M Pyo
(74) *Attorney, Agent, or Firm* — Crawford Maunu PLLC (57) ABSTRACT

Disclosed approaches for performing a Burrows-Wheeler transform (BWT) of a sequence of data elements, S, include determining sets of less-than values and sets of equal-to values for the data elements. Index values are determined for the data elements based on the sets of less-than values. Each index value indicates a count of data elements of S that a data element is lexicographically greater than. Rank values are determined for the data elements of S based on the sets of less-than values and the sets of equal-to values. Each rank value indicates for the data element an order of the data element in the BWT relative to other ones of the data elements of equal value. Positions in the BWT of S for the data elements are selected based on the index values and rank values, and the data elements are output in the order indicated by the respective positions in the BWT.

20 Claims, 6 Drawing Sheets

BWT CIRCUIT ARRANGEMENT AND METHOD

TECHNICAL FIELD

The disclosure generally relates to Burrows-Wheeler transforms (BWTs).

BACKGROUND

The Burrows-Wheeler Transform (BWT) is a reversible transform that is often used as a pre-cursor to data compression and other applications. For compression applications, the BWT inputs a block of data elements and reorders the data elements in a manner that can make compression of that data more effective. The BWT can also be used in next-generation sequencing (NGS) of DNA. NGS involves algorithms that align sequences of DNA. The alignment algorithms can employ the BWT to reduce computational requirements.

The BWT inputs a block of data elements, such as a string of N characters, forms N rotations of those characters, and lexicographically sorts the rotations. The BWT string is formed from the last characters in the strings of the sorted rotations. Though the BWT can improve the performance of algorithms that process the transformed data, computing the BWT can be costly. Depending on the implementation, the sorting of rotations can consume significant computation cycles and/or require significant memory resources.

SUMMARY

A disclosed method includes determining respective sets of less-than values for a plurality of data elements of a sequence of data elements, S. Each less-than value indicates whether or not the data element is lexicographically less than another data element of S. The method determines for each data element of S, a set of equal-to values. Each equal-to value indicates whether or not the data element is lexicographically equal to another data element of S. The method determines respective index values for the data elements of S based on the sets of less-than values. Each index value indicates a count of data elements of S that a data element is lexicographically greater than. The method determines respective rank values for the data elements of S based on the sets of less-than values and the sets of equal-to values. Each rank value indicates for the data element an order of the data element in a Burrows-Wheeler transform (BWT) of S relative to other ones of the data elements of equal value. The method selects respective positions in the BWT of S for the data elements of S based on the respective index values and respective rank values. The method outputs the data elements of S in an order indicated by the respective positions in the BWT.

A disclosed system includes a preparation circuit, an index computation circuit, a rank computation circuit, and a write control circuit. The preparation circuit is configured to determine respective sets of less-than values for a plurality of data elements of a sequence of data elements, S. Each less-than value indicates whether or not the data element is lexicographically less than another data element of S. The preparation circuit is additionally configured to determine for each data element of S, a set of equal-to values. Each equal-to value indicates whether or not the data element is lexicographically equal to another data element of S. The index computation circuit is configured to determine respective index values for the data elements of S based on the sets of less-than values. Each index value indicates a count of data elements of S that a data element is lexicographically greater than. The rank computation circuit is configured to determine respective rank values for the data elements of S based on the sets of less-than values and the sets of equal-to values. Each rank value indicates for the data element an order of the data element in a Burrows-Wheeler transform (BWT) of S relative to other ones of the data elements of equal value. The write control circuit is configured to determine respective positions in the BWT of S for the data elements of S based on the respective index values and respective rank values. The write control circuit is additionally configured to write the data elements of S to a memory at addresses indicated by the respective positions in the BWT.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Unlike most BWT algorithms, the disclosed approaches provide a data-independent sorting algorithm. In addition, the disclosed methods and circuitry do not require substantial memory resources. The computational complexity of the transformation is O(N), and the storage overhead for the transformation is three bits per data element. In addition to BWT computation time scaling linearly relative to the size of the input, the transform can be accelerated by a hardware implementation, because comparison and summation functions are primary functions underlying the disclosed approaches. The methods and circuitry are amenable to scaling using application specific integrated circuits (ASICs) or field programmable gate arrays (FPGAs). The BWT can be divided amongst multiple compute engines (CEs) to further improve performance.

According to the disclosed methods and circuits, in performing the BTW of an input data set, S, a set of less-than values is generated. Each less-than value indicates whether or not the data element is lexicographically less than another data element of S. The methods and circuits also generate a set of equal-to values. Each equal-to value indicates whether or not the data element is lexicographically equal to another data element of S. Based on the sets of less-than values, the methods and circuits determine respective index values for the data elements of S. Each index value indicates a count of data elements of S that a data element is lexicographically greater than. The methods and circuits determine respective rank values for the data elements of S based on the sets of less-than values and the sets of equal-to values. Each rank value indicates for the data element, an order of that data element in the BWT of S relative to other ones of the data elements of equal value. Using the respective index values and respective rank values, the respective positions in the BWT of S for the data elements of S can be selected, and the data elements of S can be output in the order indicated by the respective positions in the BWT.

Figure 1:
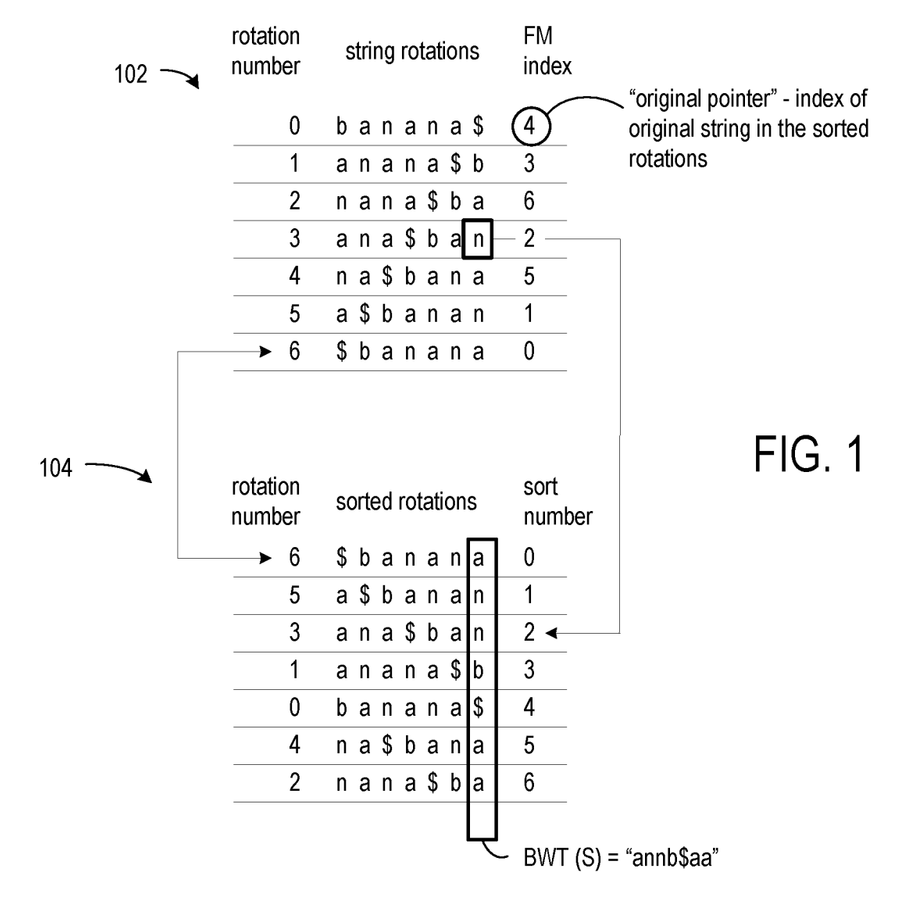
FIG. 1 illustrates the BWT of an exemplary sequence of data elements.

FIG. 1 illustrates the BWT of an exemplary sequence of data elements. In the example, "banana$" is a character string S in which "$" indicates the end of the character string. Table 102 shows the rotations of banana$, and table 104 shows the lexicographical sorted order of the rotations. The string has seven rotations, numbered 0-6. The BWT (S) is the sequence formed by the last character in the sorted rotations. Thus, BWT (S) is "aanb$aa."

The "FM index" of each string rotation in the rotation table 102 is the sort number index of that string rotation in the table 104. For example, rotation number 3 is the string, "1n1$ban" having FM index 2. In table 104, "ana$ban" is the third string (sort number 2) in the sorted order.

The "original pointer" is tracked for purposes of inverting the BWT of S when called for. The original pointer is the FM index of the original string S, which is the FM index of 4 of rotation number 0 in table 102.

According to the disclosed approaches, the BWT of an input data sequence is determined based on the FM index. That is, BWT [FM [i]]=S[i−1] for i≠0, and S[N−1] for i=0, where 0≤i≤N. FIGS. 2, 3, 4, and 5 illustrate computation of the FM indices for banana$ according to the disclosed approach.

To reduce the number of computations in generating the FM indices, the order of the data elements in the input string is reversed. The reverse order of the character string banana$ is $ananab.

Figure 2:
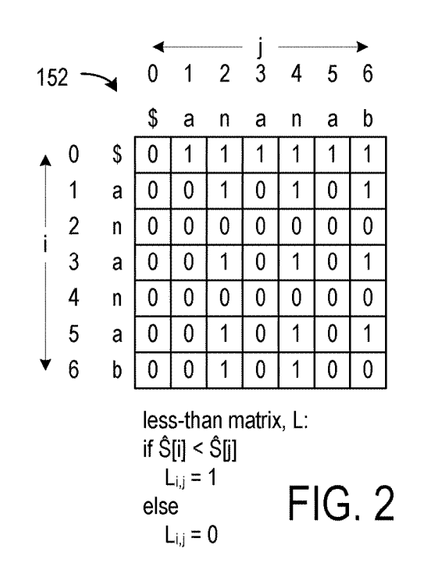
FIG. 2 shows a less-than matrix, L, generated from the inversion of banana$.

FIG. 2 shows a less-than matrix 152, L, generated from the inversion of banana$. The inversion of string S can be denoted as Ŝ. The rows i and columns j of the matrix correspond to the characters $ananab. Each element of L can be referenced as $L_{i,j}$. The disclosed approaches determine the respective sets of less-than values for the characters of Ŝ and store the less-than values in the less-than matrix 152. The less-than values can be binary values, each indicating whether or not one character of Ŝ is lexicographically less than another character of Ŝ. If Ŝ[i]<Ŝ[j], then $L_{i,j}$ can be assigned the binary value 1 (and for i≠j, $L_{j,i}$ can be assigned the binary value 0), otherwise, $L_{i,j}$ can be assigned the binary value 0 (and for i≠j, $L_{j,i}$ can be assigned the binary value 1). For example, Ŝ[3]<Ŝ[2], and $L_{3,2}$=1, and Ŝ[4]≥Ŝ[1], and $L_{4,1}$=0.

Figure 3:
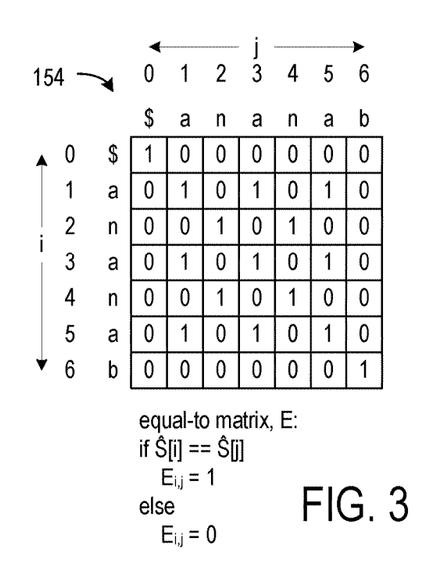
FIG. 3 shows an equal-to matrix, E, generated from the inversion of banana$.

FIG. 3 shows an equal-to matrix 154, E, generated from the inversion of banana$. The disclosed approaches determine the respective sets of equal-to values for the characters of Ŝ and store the equal-to values in the equal-to matrix 154. The equal-to values can be binary values, each indicating whether or not one character of Ŝ is lexicographically equal to another character of Ŝ. If Ŝ[i]=Ŝ[j], then $L_{i,j}$ can be assigned the binary value 1 (and $L_{j,i}$ can also be assigned the binary value 1), otherwise, $L_{i,j}$ can be assigned the binary value 0 (and $L_{j,i}$ can also be assigned the binary value 0). For example, Ŝ[2]=Ŝ[4], and $L_{2,4}$=1, and Ŝ[3]≠Ŝ[6], and $L_{3,6}$=0.

The less-than matrix 152 and equal-to matrix 154 are used in determining rank values of the characters of the input string. The rank value of a character indicates an order of the character in the BWT of S relative to other instances of the same character in S. The less-than matrix 152 and equal-to matrix 154 are used to generate a weighted matrix W, and from the weighted matrix the rank values can be determined.

Figure 4:
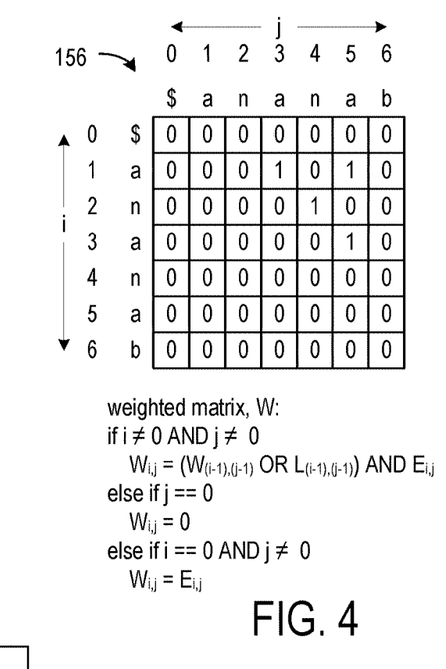
FIG. 4 shows a weighted matrix, W, generated from the exemplary less-than matrix and equal-to matrix of FIGS. 2 and 3.

FIG. 4 shows a weighted matrix 156, W, generated from the exemplary less-than matrix 152 and equal-to matrix 154 of FIGS. 2 and 3. The values in the weighted matrix can be binary values that are generated as a function of elements of the less-than matrix and the equal-to matrix. The weighted matrix tabulates the results of comparing each character to the next characters in the string, which provides a basis for ranking multiple instances of the same character.

For column 0 of the weighted matrix, the elements in all rows are assigned the binary value 0. For entries in W in row 0 and not in column 0, the elements are assigned the value of $E_{0,j}$. For entries of the weighted matrix not in row 0 or column 0, the binary value assigned to entry is the binary value of the function:

$(W_{(i-1),(j-1)}$ OR $L_{(i-1),(j-1)})$ AND $E_{i,j}$

The disclosed approach determines index values from the less-than matrix L and rank values from the weighted matrix W, and then determines the FM indices from the index values and rank values.

Each index value indicates a count of data elements of S that the data element is lexicographically greater than. Each rank value indicates an order of the character in the BWT of S relative to other instances of the same character in S. Together, the index value of a character in S and the rank value of that character indicate the FM index of the character.

Figure 5:
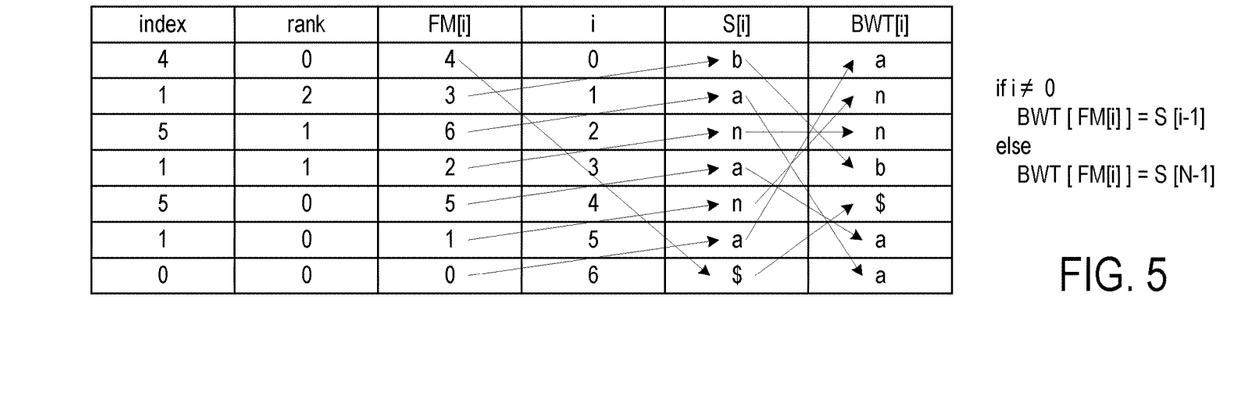
FIG. 5 shows a table of the index values, rank values, and FM indices of the exemplary character string banana$.

FIG. 5 shows a table 158 of the index values, rank values, and FM indices of the exemplary character string banana$. The table also shows the original character string, the index i of each character in the string, and the resulting BWT. The arrows illustrate the mapping of the character in the original character string to the BWT according to the function:

BWT [FM [i]]=S[i−1] for i≠0, and S[N−1] for i=0, where 0≤i≤N

The index values can be computed by summing the columns of the less-than matrix L. Thus, for Ŝ={$, a, n, a, n, a, b}, the index values are {0, 1, 5, 1, 5, 1, 4}, and for S={b, a, n, a, n, a, $}, the index values are {4, 1, 5, 1, 5, 1, 0}. Note that characters that are the same are assigned the same index value, and the lexicographically least character has an index value of 0. As "$" is the character having the lexicographically least value, the index value of "$" is 0. The character "a" is the next least value is assigned the index value 1. There are three a's in the string, and "b" has the next least value and is assigned the index value 4. As there is only a single "b," the index value of "n" is 5.

The rank values can be computed by summing the columns of the weighted matrix W. For Ŝ={$, a, n, a, n, a, b}, the rank values are {0, 0, 0, 1, 1, 2, 0}, and for S={b, a, n, a, n, a, $}, the rank values are {0, 2, 1, 1, 0, 0, 0}. The "$" and "b" characters are unique in the string and receive a rank of 0.

The weighted matrix effectively tabulates results of comparing characters in the string to respective next characters (the "suffixes"). Each of the three a's is compared to the respective suffixes in S, the respective suffixes being "n," "n," and "$." The "a" at position 5 in S is followed by $, which is the lexicographically less than the other two suffixes "n," and "n." Thus, the "a" at position 5 in S has a rank value of 0.

The "a" at position 1 and "a" at position 3 in S are both followed by an "n," and the equal lexicographical values is resolved by evaluating the suffixes of the "n" suffixes at positions 2 and 4. The "n" suffixes at positions 2 and 4 of S are both followed by "a" at positions 3 and 5, leading to a further comparison of the suffixes of the "a" at positions 3 and 5 of S. Since the suffix of "a" at position 5 of S is "$," and "$" has a lexicographically lesser value than "n," at position 4, the "a" at position 3 in S (which is at position 3 in Ŝ) receives a rank value of 1, and the "a" at position 1 in S (which is at position 5 in Ŝ) receives a rank value of 2.

The FM indices of the characters can be computed as the sums of the respective index values and rank values. For example, the FM index of "b" is 4, which is the sum of index value 4 and rank value 0, and the index value of "a" at position 3 in S is 2, which is the sum of index value 1 and rank value 1.

The BWT can be determined based on the FM index values, which are associated with the characters of S. The characters of S can be referenced by index i as S[i], where 0<i (N−1), and the associated FM index values can also be referenced by i as FM[i]. Thus, S[0]="b," S[1]="a," . . . , S[6]="$." FM[0]=4, FM[1]=3, . . . , FM[6]=0. The characters of BWT(S) can be referenced by index i as BWT[i]. For i=0, BWT [FM[i]]=S[N−1], and for i≠0, BWT [FM[i]]=S[i−1]. In the exemplary table 158, for i=0, FM[0]=4. Thus, BWT[4]=S[7−1]="$." For i=2, FM[2]=6, and BWT[6]=S[2−1]="a." The characters of the transformed string can be stored in a memory at storage locations indicated by the FM indices.

Figure 6:
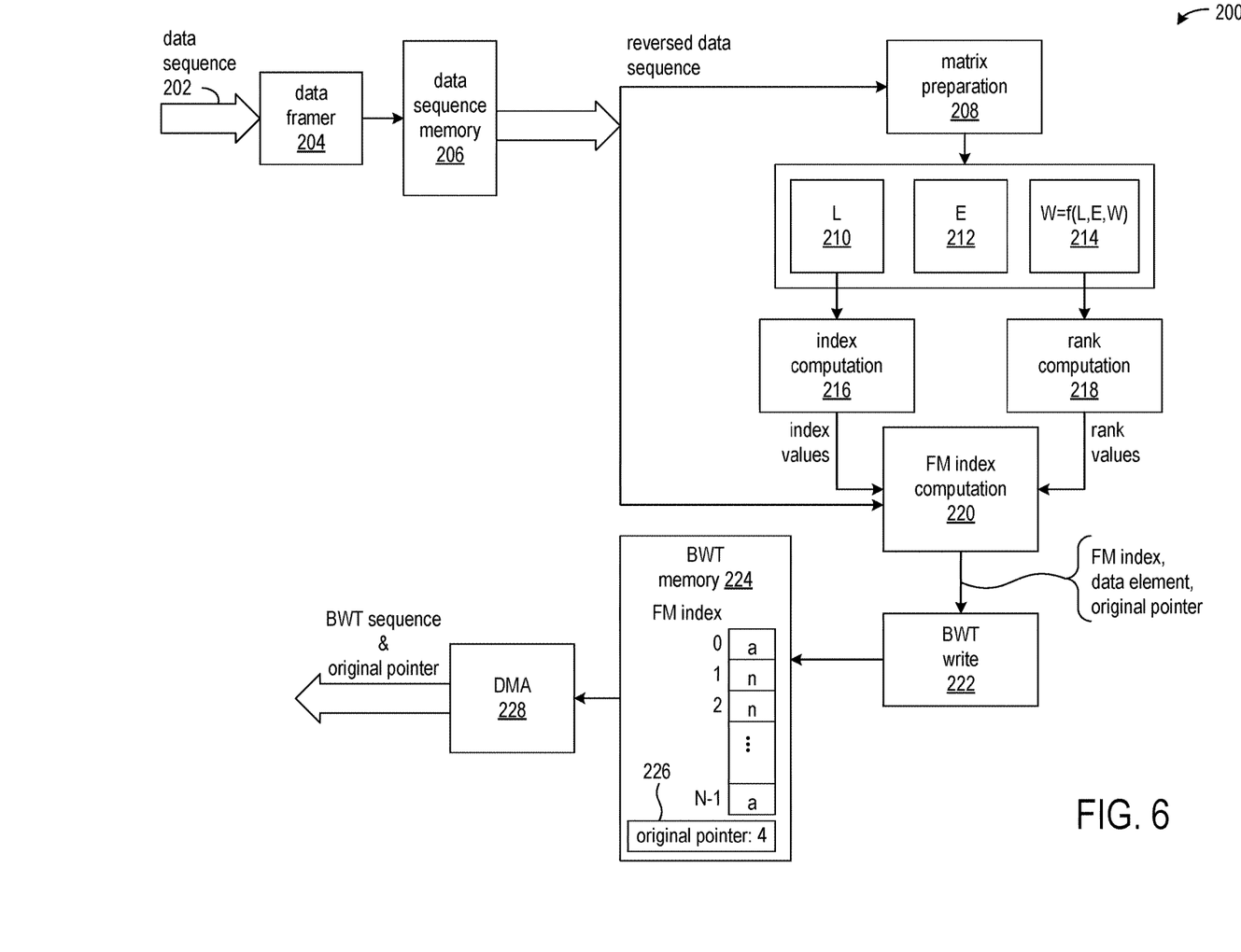
FIG. 6 shows a system that performs a BWT of an input data sequence according to the disclosed methods.

FIG. 6 shows a system that performs a BWT of an input data sequence according to the disclosed methods. The function blocks represent hardwired integrated circuitry, FPGA circuitry, and/or one or more microprocessors executing program code. Thus, each of the blocks can also be referred to as a circuit configured to perform the specified function(s), and collectively the circuitry can be referred to as a circuit arrangement. The memory blocks represent one or more single or multi-port RAMs implemented by on-chip or off-chip memory circuits, block RAM or look-up table RAM of an FPGA device, or a combination thereof.

In performing the BWT, the system 200 generally reverses the order of an input data sequence 202, determines FM indices of data elements of the data sequence, and outputs or stores the BWT of the data sequence for subsequent application processing. The data framer 204 inputs the sequence of data elements 202 and stores the data elements in reverse order in the data sequence memory 206. Examples of data sequences include strings of characters, audio data, video data, image data, etc.

The matrix preparation block 208 can be coupled to the data sequence memory by address and data signal lines for reading data elements of the reversed data sequence. The matrix preparation block generates sets of less-than values and sets of equal-to values. The sets of less-than values are stored in the L matrix 210, and the sets of equal-to values are stored in the E matrix 212. As indicated above, the less-than values can be binary values, each indicating whether or not one character of Ŝ is lexicographically less than another character of Ŝ, and the equal-to values can be binary values, each indicating whether or not one character of Ŝ is lexicographically equal to another character of Ŝ. The less-than matrix 152 and the equal-to matrix 154 of FIGS. 2 and 3 exemplify the L matrix 210 and E matrix 212, respectively.

The matrix preparation block 208 generates the W matrix 214 based on the less-than values in the L matrix 210, the equal-to values in the E matrix 212, and previously generated values in the W matrix. As indicated above, the weighted matrix tabulates the results of comparing each character to the next characters in the string S, which provides a basis for ranking multiple instances of the same character. The W matrix 156 of FIG. 4 exemplifies the W matrix 214.

The L, E, and W matrices 210, 212, 214 can be stored in one or more RAMs, which can be implemented in block RAM or LUT RAM of an FPGA device or on-chip memory circuitry of a system-on-chip (SoC), for example.

The generation of FM indices for the BWT involves multiple computations, which can be performed concurrently and pipelined. The index computation block 216 generates index values from the less-than matrix 210. Each index value indicates a count of data elements of the input data sequence that a data element in the sequence is lexicographically greater than. Each index value can be determined as a sum of a column of the less-than matrix. The rank computation block 218 generates rank values from the weighted matrix 214. Each rank value indicates an order of the data element in the BWT of the input data sequence relative to other instances of the same data element in the sequence. Each rank value is a sum of a column of the weighted matrix. The index computation and rank computation can be performed concurrently, and paired index and rank values can be input to the FM computation block 220. The index value and the rank value in each pair are the sums of the same numbered column in the less-than and weighted matrices.

The FM index computation block 220 computes an FM index as the sum of the index value and rank value in a paired input. The FM index computation block 220 can count the pairs of index and rank values input for processing in order to track the indices of the data elements in the input data sequence associated with the pairs of index and rank values.

The FM index computation block 220 can determine which data element to read from the data sequence memory based on the tracked index. For an input data sequence having N data elements indexed from 0 to (N−1) and the tracked index i, where 0<i≤(N−1), the data element indexed by [i−1] is read from the data sequence memory 206 to correspond to the computed FM index. For i=0, the data element indexed by [N−1] is read from the data sequence memory.

The FM index computation block 220 outputs the FM index and data element read from the data sequence memory. If the tracked index references the first data element of the input data sequence (e.g., i=0), then the computed FM index is the original pointer, which is also signaled by the FM index computation block to the BWT write control block 222.

In response to the input FM indices and data elements, the BWT write control block 222 stores the data elements in the BWT memory 224 at storage locations referenced by the FM indices. The FM indices can be memory addresses or offsets from a memory address, for example. The storage locations are referenced as 0–N−1 in the BWT memory 224. In response to the FM index computation block signaling that the output FM index is the original pointer, the BWT write block stores the value of the FM index in a storage location 226 and dedicated to original pointer in association with the BWT ordering of the data sequence. For purposes of illustration, the BWT of the exemplary character string banana$ is shown as stored in the BWT memory along with the original pointer of 4.

The BWT memory 224 can be accessed via a direct memory access (DMA) controller 228.

Figure 7:
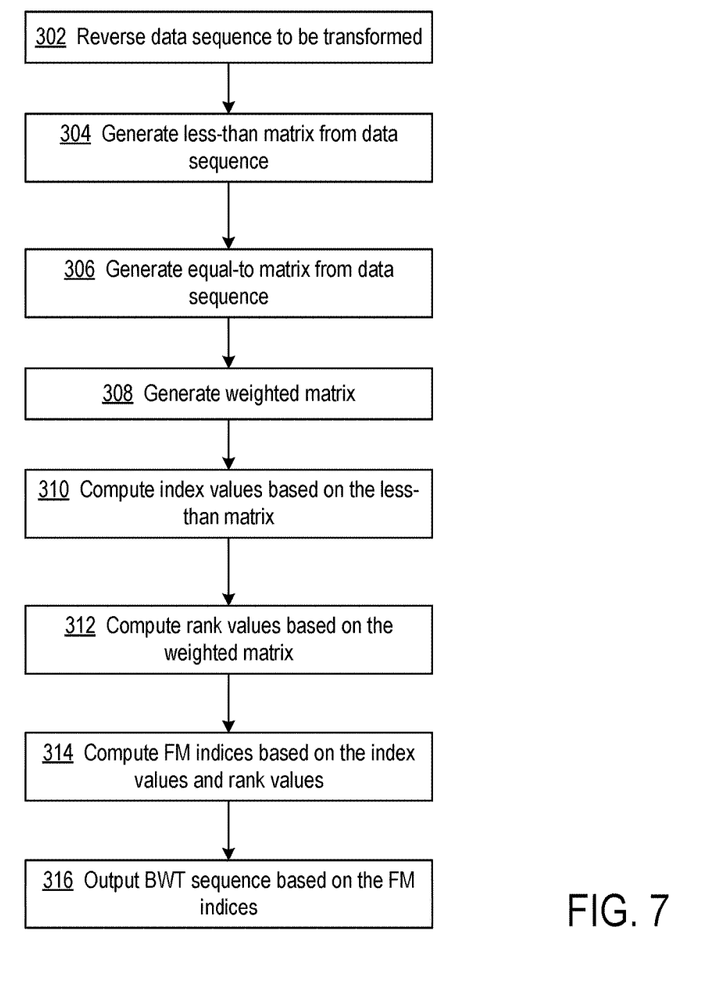
FIG. 7 shows a flowchart of an exemplary process of generating a BWT of an input data sequence.

FIG. 7 shows a flowchart of an exemplary process of generating a BWT of an input data sequence. At block 302, a data framing circuit reverses the order of data elements in the data sequence. A matrix preparation circuit at block 304 generates sets of less-than values and stores the sets of less-than values in a less-than matrix in a memory circuit. At block 306, the matrix preparation circuit generates sets of equal-to values and stores the sets of equal-to values in an equal-to matrix. The matrix preparation circuit generates the weighted matrix at block 308.

An index computation circuit computes and outputs index values from columns of the less-than matrix at block 310. At block 312, a rank computation circuit computes and outputs rank values from columns of the weighted matrix. An FM computation circuit at block 314 computes FM indices from the less-than values and rank values and identifies the original pointer for the data sequence. At block 316, a BWT write circuit outputs the BWT of the input data sequence based on the generated FM indices associated with index values 0 through N−1 of the input data sequence according to the transformation:

BWT [FM [i]]=S[i−1] for i≠0, and S[N−1] for i=0, where 0≤i≤N.

Figure 8:
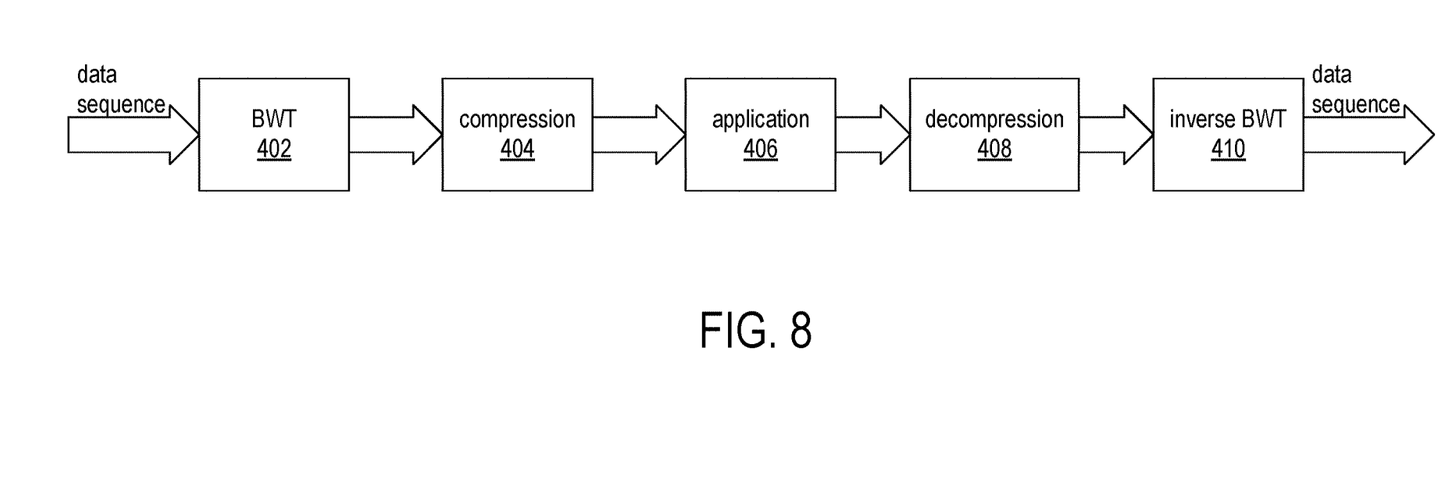
FIG. 8 shows an exemplary system in which a BWT is applied to a data sequence prior to compression of the data.

FIG. 8 shows an exemplary system in which a BWT is applied to a data sequence prior to compression of the data. Circuit block 402 performs a BWT on the input data sequence according to the approaches disclosed in FIGS. 2-7. Circuit block 404 compresses the transformed data sequence according to an application-specific compression algorithm, such as move-to-forward and Huffman encoding, arithmetic coding, or bzip2, for example.

Circuit block 406 can be any application that can benefit from data compression, such as applications involving storage or communication of large data sequences. Circuit block 408 decompresses the compressed data produced by circuit block 404. Circuit block 410 performs an inverse BWT on the decompressed data using recognized approaches.

Figure 9:
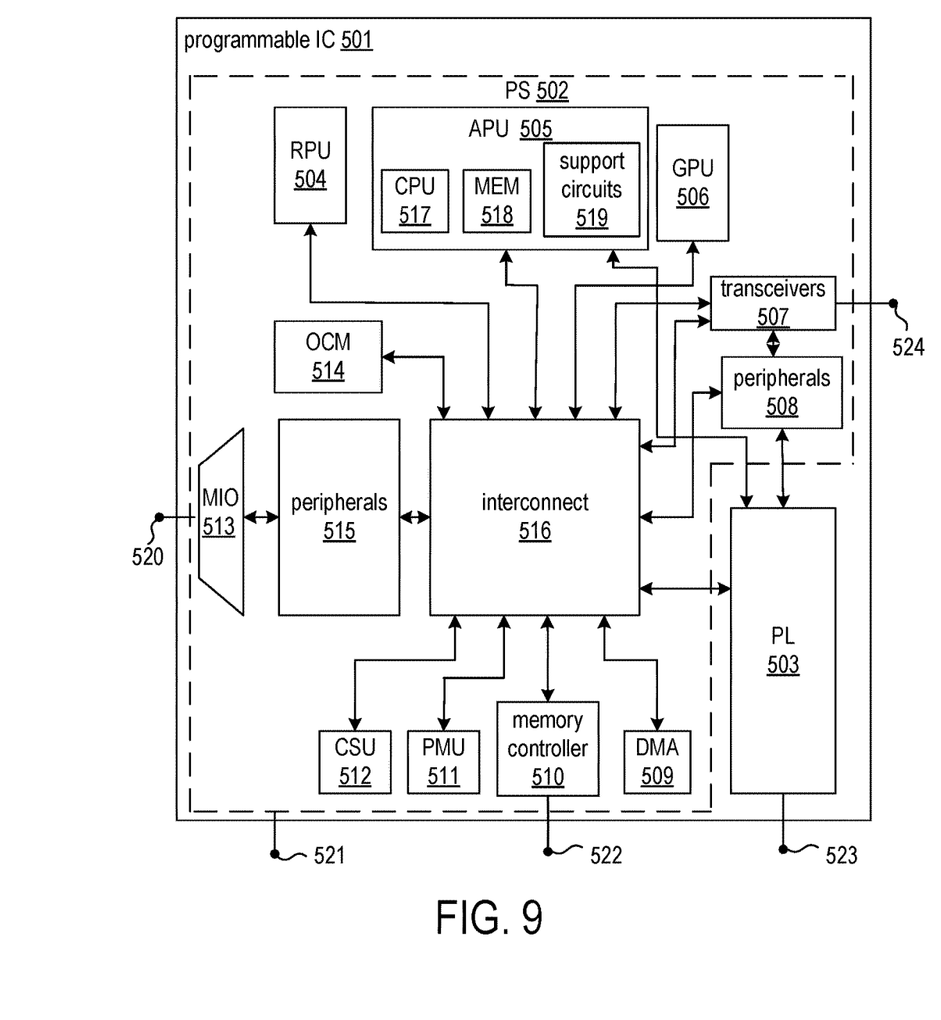
FIG. 9 is a block diagram depicting a System-on-Chip (SoC) on which the disclosed BWT circuitry can be implemented according to an example.

FIG. 9 is a block diagram depicting a System-on-Chip (SoC) 501 on which the disclosed BWT circuitry can be implemented according to an example. In the example, the SoC includes the processing subsystem (PS) 502 and the programmable logic subsystem 503. The processing subsystem 502 includes various processing units, such as a real-time processing unit (RPU) 504, an application processing unit (APU) 505, a graphics processing unit (GPU) 506, a configuration and security unit (CSU) 512, and a platform management unit (PMU) 511. The PS 502 also includes various support circuits, such as on-chip memory (OCM) 514, transceivers 507, peripherals 508, interconnect 516, DMA circuit 509, memory controller 510, peripherals 515, and multiplexed (MIO) circuit 513. The processing units and the support circuits are interconnected by the interconnect 516. The PL subsystem 503 is also coupled to the interconnect 516. The transceivers 507 are coupled to external pins 524. The PL 503 is coupled to external pins 523. The memory controller 510 is coupled to external pins 522. The MIO 513 is coupled to external pins 520. The PS 502 is generally coupled to external pins 521. The APU 505 can include a CPU 517, memory 518, and support circuits 519. The APU 505 can include other circuitry, including L1 and L2 caches and the like. The RPU 504 can include additional circuitry, such as L1 caches and the like. The interconnect 516 can include cache-coherent interconnect or the like.

Referring to the PS 502, each of the processing units includes one or more central processing units (CPUs) and associated circuits, such as memories, interrupt controllers, direct memory access (DMA) controllers, memory management units (MMUs), floating point units (FPUs), and the like. The interconnect 516 includes various switches, busses, communication links, and the like configured to interconnect the processing units, as well as interconnect the other components in the PS 502 to the processing units.

The OCM 514 includes one or more RAM modules, which can be distributed throughout the PS 502. For example, the OCM 514 can include battery backed RAM (BBRAM), tightly coupled memory (TCM), and the like. The memory controller 510 can include a DRAM interface for accessing external DRAM. The peripherals 508, 515 can include one or more components that provide an interface to the PS 502. For example, the peripherals can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose (GPIO) ports, serial advanced technology attachment (SATA) ports, PCIe ports, and the like. The peripherals 515 can be coupled to the MIO 513. The peripherals 508 can be coupled to the transceivers 507. The transceivers 507 can include serializer/deserializer (SERDES) circuits, MGTs, and the like.

Various logic may be implemented as circuitry to carry out one or more of the operations and activities described herein and/or shown in the figures. In these contexts, the circuits may be referred to as "logic," "module," "engine," or "block." It should be understood that logic, modules, engines and blocks are all circuits that carry out one or more of the operations/activities. For example, in some of the above-discussed implementations, one or more modules are discrete logic circuits or programmable logic circuits configured and arranged for implementing these operations/activities, as in the logic, modules, engines, and blocks shown in FIGS. 6, 8, and 9. In certain implementations, the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Though aspects and features may in some cases be described in individual figures, it will be appreciated that features from one figure can be combined with features of another figure even though the combination is not explicitly shown or explicitly described as a combination.

The disclosed approaches are thought to be applicable to a variety of systems for performing BWTs. Other aspects and features will be apparent to those skilled in the art from consideration of the specification. The methods and circuits can be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
   determining by a preparation circuit and storing in memory circuitry, respective sets of less-than values for a plurality of data elements of a sequence, "S", of data elements, wherein each less-than value indicates whether or not the data element is lexicographically less than another data element of S;
   determining for each data element of S by the preparation circuit and storing in the memory circuitry, a set of equal-to values, wherein each equal-to value indicates whether or not the data element is lexicographically equal to another data element of S;
   determining by an index computation circuit, respective index values for the data elements of S based on the sets of less-than values, wherein each index value indicates a count of data elements of S that a data element is lexicographically greater than;
   determining by a rank computation circuit, respective rank values for the data elements of S based on the sets of less-than values and the sets of equal-to values, wherein each rank value indicates for the data element an order of the data element in a Burrows-Wheeler transform (BWT) of S relative to other ones of the data elements of equal value;
   selecting by a write control circuit, respective positions in the BWT of S for the data elements of S based on sums of the respective index values and respective rank values; and
   writing the data elements of S to the memory circuitry by the write control circuit in an order indicated by the respective positions in the BWT.

2. The method of claim 1, further comprising:
   generating by the preparation circuit a less-than matrix that specifies the respective sets of less-than values; and
   wherein the determining the respective index values includes summing columns of the less-than matrix.

3. The method of claim 2, wherein the generating the less-than matrix includes:
   assigning a first less-than value to an element at row i, column j, in response to S[i]<S[j]; and
   assigning a second less-than value to an element at row i, column j, in response to S[i]≥S[j].

4. The method of claim 2, further comprising:
   generating by the preparation circuit, an equal-to matrix that specifies the respective sets of equal-to values;
   generating by the preparation circuit, a weighted matrix having values that are a function of elements of the less-than matrix and the equal-to matrix; and
   wherein the respective rank values are sums of columns of the weighted matrix.

5. The method of claim 1, further comprising:
   generating by the preparation circuit, a less-than matrix, "L", that specifies the respective sets of less-than values, wherein the generating the less-than matrix includes:
   assigning a first less-than value to an element at row i, column j of the less-than matrix, in response to S[i]<S[j], and
   assigning a second less-than value to an element at row i, column j of the less-than matrix, in response to S[i]≥S[j];
   wherein the determining the respective index values includes summing columns of the less-than matrix;
   generating by the preparation circuit, an equal-to matrix, "E", that specifies the respective sets of equal-to values, wherein the generating the equal-to matrix includes:
   assigning a first equal-to value to an element at row i, column j of the equal-to matrix, in response to S[i]=S[j], and
   assigning a second equal-to value to an element at row i, column j of the equal-to matrix, in response to S[i]≠S[j];
   generating by the preparation circuit, a weighted matrix having values that are a function of elements of the less-than matrix and the equal-to matrix; and
   wherein the respective rank values are sums of columns of weighted matrix.

6. The method of claim 5, wherein the generating the weighted matrix includes:
   assigning to an element at row i, column j of the weighted matrix, "W", for rows i≠0 and columns j≠0 of the weighted matrix, one of a first weight value or a second weight value in response to evaluation of ($W_{(i-i),(j-1)}$ OR $L_{(i-1),(j-1)}$) AND $E_{i,j}$;
   assigning to an element at row i, column j of the weighted matrix, W, for column 0, the second weight value; and
   assigning to an element at row i, column j of the weighted matrix, W, for row 0 columns j≠0, a value $E_{i,j}$.

7. The method of claim 6, wherein:
   S has N data elements indexed 0 through N−1, wherein N>0;
   the selecting respective positions in the BWT of S includes:
   determining respective final index values, FM[0], . . . , FM[N−1], for the data elements S[0], . . . , S[N−1] based on the respective index values and respective rank values; and
   the writing includes:
   storing, for 0<i≤(N−1), the data element at S [i−1] in a storage location referenced by the respective final index value FM[i]; and
   storing, for i=0, the data element S [N−1] in a storage location referenced by the respective final index value FM[0].

8. The method of claim 1 wherein:
   S has N data elements indexed 0 through N−1, wherein N>0;
   the selecting respective positions in the BWT of S includes:
   determining respective final index values, FM[0], . . . , FM[N−1], for the data elements S[0], . . . , S[N−1] based on the respective index values and respective rank values; and
   the writing includes:
   storing, for 0<i≤(N−1), the data element at S [i−1] in a storage location referenced by the respective final index value FM[i]; and
   storing, for i=0, the data element S [N−1] in a storage location referenced by the respective final index value FM[0].

9. The method of claim 1, for the respective position the BWT of S of the data element at S[1], outputting by the index computation circuit, an original pointer value that indicates the respective position.

10. The method of claim 1, further comprising compressing by a compression circuit, the data elements output in the order indicated by the respective positions in the BWT.

11. A system comprising:
a preparation circuit configured to:
determine respective sets of less-than values for a plurality of data elements of a sequence, "S", of data elements, wherein each less-than value indicates whether or not the data element is lexicographically less than another data element of S; and
determine for each data element of S a set of equal-to values, wherein each equal-to value indicates whether or not the data element is lexicographically equal to another data element of S;
an index computation circuit configured to determine respective index values for the data elements of S based on the sets of less-than values, wherein each index value indicates a count of data elements of S that a data element is lexicographically greater than;
a rank computation circuit configured to determine respective rank values for the data elements of S based on the sets of less-than values and the sets of equal-to values, wherein each rank value indicates for the data element an order of the data element in a Burrows-Wheeler transform (BWT) of S relative to other ones of the data elements of equal value;
a write control circuit configured to:
determine respective positions in the BWT of S for the data elements of S based on sums of the respective index values and respective rank values; and
write the data elements of S to a memory at addresses indicated by the respective positions in the BWT.

12. The system of claim 11, wherein:
the preparation circuit is configured to generate a less-than matrix that specifies the respective sets of less-than values; and
the index computation circuit is configured to determine the respective index values includes summing columns of the less-than matrix.

13. The system of claim 12, wherein the preparation circuit is configured to:
assign a first less-than value to an element at row i, column j of the less-than matrix, in response to S[i]<S[j]; and
assign a second less-than value to an element at row i, column j of the less-than matrix, in response to S[i]≥S[j].

14. The system of claim 12, wherein:
the preparation circuit is configured to:
generate an equal-to matrix that specifies the respective sets of equal-to values; and
generate a weighted matrix having values that are a function of elements of the less-than matrix and the equal-to matrix; and
the rank computation circuit is configured to sums of columns of weighted matrix to generate the respective rank values.

15. The system of claim 11, wherein:
the preparation circuit is configured to:
generate a less-than matrix, "L", that specifies the respective sets of less-than values, wherein the generating the less-than matrix includes:
assign a first less-than value to an element at row i, column j of the less-than matrix, in response to S[i]<S[j],
assign a second less-than value to an element at row i, column j of the less-than matrix, in response to S[i]≥S[j];
generate an equal-to matrix, "E", that specifies the respective sets of equal-to values;
assign a first equal-to value to an element at row i, column j of the equal-to matrix, in response to S[i]=S[j],
assign a second equal-to value to an element at row i, column j of the equal-to matrix, in response to S[i]≠S[j]; and
generate a weighted matrix having values that are a function of elements of the less-than matrix and the equal-to matrix;
the index computation circuit is configured to sum values in columns of the less-than matrix in determining the respective index values; and
the rank computation circuit is configured to sum values in columns of weighted matrix.

16. The system of claim 15, wherein the preparation circuit is configured to:
assign to an element at row i, column j of the weighted matrix, "W", for rows i≠0 and columns j≠0 of the weighted matrix, one of a first weight value or a second weight value in response to evaluation of ($W_{(i-1),(j-1)}$ OR $L_{(i-1),(j-1)}$) AND $E_{i,j}$;
assign to an element at row i, column j of the weighted matrix, W, for column 0, the second weight value; and
assign to an element at row i, column j of the weighted matrix, W, for row 0 columns j≠0, a value $E_{i,j}$.

17. The system of claim 16, wherein S has N data elements indexed 0 through N−1, N>0, and the selecting respective positions in the BWT of S includes:
determining respective final index values, FM[0], . . . , FM[N−1], for the data elements S[0], . . . , S[N−1] based on the respective index values and respective rank values; and
storing, for 0<i≤(N−1), the data element at S [i−1] in a storage location referenced by the respective final index value FM[i]; and
storing, for i=0, the data element S [N−1] in a storage location referenced by the respective final index value FM[0].

18. The system of claim 11 wherein S has N data elements indexed 0 through N−1, N>0, and the write control circuit is configured to:
determine respective final index values, FM[0], FM[N−1], for the data elements S[0], . . . , S[N−1] based on the respective index values and respective rank values; and
store, for 0<i≤(N−1), the data element at S [i−1] in a storage location referenced by the respective final index value FM[i]; and
store, for i=0, the data element S [N−1] in a storage location referenced by the respective final index value FM[0].

19. The system of claim 11, the write control circuit is configured to, for the respective position the BWT of S of the data element at S[1], write to the memory an original pointer value that indicates the respective position.

20. The system of claim 11, further comprising a compression circuit configured to compress the data elements in the order indicated by the respective positions in the BWT.

* * * * *